April 28, 1964 I. M. ROSS 3,131,311

SEMICONDUCTOR PULSE GENERATORS

Filed June 21, 1960

INVENTOR
I. M. ROSS
BY H. W. Lockhart
ATTORNEY

United States Patent Office 3,131,311
Patented Apr. 28, 1964

3,131,311
SEMICONDUCTOR PULSE GENERATORS
Ian M. Ross, Summit, N.J., assignor to Bell Telephone Laboratories, Incorporated, New York, N.Y., a corporation of New York
Filed June 21, 1960, Ser. No. 37,739
2 Claims. (Cl. 307—88.5)

This invention relates generally to semiconductor pulse generators and, more particularly, to bistable circuit arrangements in which the switching operation depends upon semiconductor devices.

Bistable or flip-flop circuits for the generation of voltage pulses are well known. In particular, circuit arrangements including semiconductor devices for such purposes are disclosed in U.S. Patents 2,622,212 and 2,787,712.

A principal object of this invention is an improved bistable pulse generator and, more particularly, a semiconductor pulse generator of greater simplicity having a fewer number of components than in arrangements previously known.

One embodiment of this invention comprises a PNPN semiconductor triode switch and a three-zone NPN semiconductor triode connected in parallel relation, and a resistance element connected in series with the semiconductor elements to form a series-parallel network. In particular, the PNPN triode switch has a regenerative characteristic and thus remains in the low or high impedance state even after removal of the trigger pulse. The low resistance connection to the P-type conductivity intermediate zone of the PNPN triode is a first input terminal and the base connection to the intermediate P-type region of the NPN triode is a second input terminal. An output terminal is connected at a point between the resistance element and the semiconductor elements. Means are provided for maintaining a voltage which is less than the characteristic breakdown voltage of the PNPN and of the NPN device across the series-parallel arrangement of the resistance and semiconductor elements. In addition, this voltage is of a polarity to bias two of the PN junctions of the PNPN in the forward direction and the remaining middle junction in reverse.

In the absence of an applied voltage at either of the input terminals, both semiconductor elements will remain in the high impedance, nonconducting state and the voltage observed at the output terminal is substantially the voltage maintained across the network. The application of a voltage pulse to the first input terminal induces conduction in the PNPN element and, because the resistance of the serially connected resistance element is chosen so that the current which flows as a result of the externally applied voltage is at least equal to the value of current required to sustain conduction in the PNPN, this element will remain in the low impedance condition. The voltage at the output terminal under this condition drops to a relatively low value because of the small voltage drop across the PNPN semiconductor element.

The application now of a voltage pulse to the second input terminal enables conduction in the NPN element. The NPN element is driven into saturation and, in effect, represents a lower impedance than the PNPN device and conduction therefore tends to shift to the NPN branch. When this occurs the current in the PNPN is reduced below the value required to sustain conduction and the PNPN element therefore turns off. Conduction continues in the NPN branch only so long as the voltage is applied to the intermediate region of the semiconductor element. During this period the voltage at the output terminal further is reduced slightly because the voltage drop across the NPN is less than that across the PNPN element when it was in the conducting state. As soon as the voltage pulse is removed from the NPN element, it resumes the high impedance, nonconducting state and the voltage at the output terminal returns again to a value substantially equal to the externally applied voltage.

Thus, the arrangement described provides an output voltage characteristic which shifts back and forth substantially between two particular values in response to input voltage pulses applied successively at two separated terminals. Such an arrangement finds use in a variety of signaling apparatus.

Thus, a primary feature of this invention is a circuit including a parallel array of a four-zone and a three-zone semiconductor triode.

In another embodiment of the invention the four-zone PNPN and the three-zone NPN are combined, in effect, in a single integrated semiconductor body having input and output terminal arrangements analogous to those of the embodiment described above.

The integrated device, in accordance with this invention, provides a compact structure which is fabricated readily by substantially the process required to produce the less complex PNPN triode switch. The smaller volume and simplification of external connections in the case of the integrated device are also desirable advantages.

The invention and its objects and features will be more clearly understood from the following detailed description taken in connection with the drawing in which.

Figure 1:
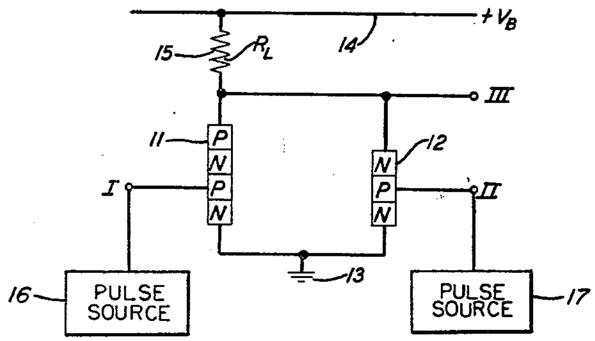
FIG. 1 is a diagram of one form of the invention using separate PNPN and NPN elements.

Referring to the drawing, FIG. 1 shows one basic embodiment of the invention including a four-zone PNPN semiconductor triode 11 connected in parallel with a three-zone NPN semiconductor triode 12. Both semiconductor elements are well known in the art. In particular, one suitable form of the PNPN device is described in U.S. Patent 2,877,359.

One terminal electrode of each of the semiconductor elements 11 and 12 is connected to a ground terminal 13 which represents the negative side of the voltage supply, while the other terminal electrode of each is connected to an output terminal designated III. A resistance element 15 is serially connected between the output terminal III and the positive side of the voltage supply, shown schematically by the line 14. A first input terminal, designated I, is connected to the P-type intermediate zone of the PNPN triode 11 and a second input terminal, designated II, is connected to the P-type intermediate zone of the NPN triode 12.

In the operation of this circuit arrangement, as generally described hereinbefore, the voltage maintained by the line 14 is less than the voltage required to produce significant conduction in either of the semiconductor elements in the absence of any input signal to either input terminal, and the value of the resistance element 15 is such that the current which flows when the circuit is closed through the PNPN element is greater than the current necessary to sustain conduction in the four-zone semiconductor element. A typical PNPN element suitable for use in this circuit has a breakdown voltage of 30 volts and a sustaining current of five milliamperes. Consequently, for a maintained voltage of about ten volts, the resistance element 15 suitably has a resistance of 1000 ohms.

In this particular circuit configuration, the applied voltage is positive with respect to ground so that the two outer PN junctions of the PNPN element are biased in the forward direction and the center junction is biased in reverse. The trigger pulses referred to hereinafter are of the same polarity as the applied voltage and effectively serve to increase the bias on the junction biased in reverse.

Figure 2:
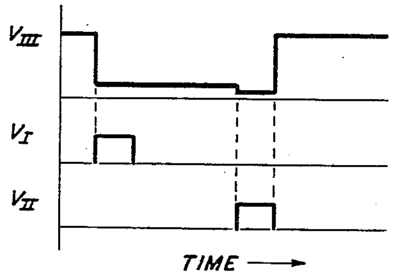
FIG. 2 is a graph of the input and output voltage characteristics.

In one stable condition of the circuit, the voltage observed at the output terminal III is substantially the same as the applied voltage as shown in the top portion of the graph of FIG. 2. FIG. 2 includes in graphic form the voltage on each of the three terminals I, II and III plotted against time. If now a voltage pulse of appropriate amplitude, typically about one volt, is applied for a period of about one microsecond from pulse source 16 to terminal I, the impedance of the four-zone device will be switched from a high value to a low value in accordance with principles set forth in the patent referred to above. Because the current which now flows in this branch as a consequence of the applied voltage is in excess of the sustaining current for the PNPN device, the low impedance state will persist even after the voltage applied to terminal I is removed. In this condition the voltage at terminal III typically drops from about ten volts to about one-half volt, the latter value corresponding to the voltage drop across the PNPN semiconductor triode.

The circuit will remain in this condition until a voltage pulse of appropriate amplitude is applied from pulse source 17 to the terminal II to induce conduction through the three-zone NPN element. As depicted in the graph of FIG. 2, this voltage pulse typically has an amplitude and duration comparable to the first input voltage pulse at terminal I. The application of this trigger pulse to the base of the NPN element 12 results in a saturation current therethrough which diverts current away from the PNPN element 11 to a value less than that necessary to sustain conduction therein. Essentially, the pulse serves to reduce for its duration the impedance of the NPN element whereby it gets an increased portion of the current from the line 14. Thus, the effect is to shift conduction from the PNPN branch to the NPN branch with a slight lowering of the voltage observed at the output terminal III because of the slightly decreased voltage drop across the NPN element as compared to that across the PNPN device. As shown in the curve of FIG. 2, the difference is inconsequential and the voltage is substantially unchanged.

However, upon termination of the second trigger pulse, the NPN element 12 immediately resumes the high impedance or nonconducting condition, the PNPN element 11 persists in the high impedance state it assumed when element 12 was switched to a low impedance state, and the voltage at output terminal III returns again to the higher value which is substantially equal to the applied voltage. Thus, by the proper combination of two semiconductor triodes and a resistance element, a first trigger pulse produces conduction in the four-zone semiconductor triode and the application of a second trigger pulse to an NPN semiconductor triode terminates conduction in the four-zone element. By placing this parallel configuration in series with a properly selected resistance element, the voltage observed across the semiconductor elements can be triggered back and forth between two stable values by successively applied input trigger pulses. The arrangement described provides a considerable simplification over arrangements previously known.

It will be understood that the orientation of the PNPN element may be reversed in the circuit which, in turn, requires a reversal of the polarity of the applied voltages as well as the use of a PNP element in place of the NPN.

Furthermore, the flip-flop or bistable characteristic response of the circuit of this invention is realized also if the resistance element 15 is located on the ground side of the parallel branches with the output terminal III between the semiconductor elements 11 and 12 and the resistance element. In such an arrangement the voltage response at terminal III will be an inversion of that shown in FIG. 2.

Figure 3:
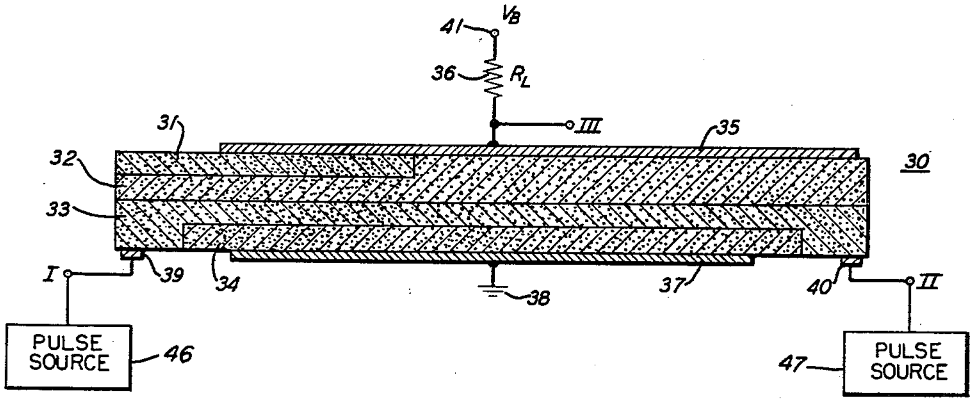
FIG. 3 is a diagram of an embodiment including an integrated semiconductor device.

In a further specific embodiment of the invention, the semiconductor elements 11 and 12 of the arrangement of FIG. 1 may be integrated in the form shown in FIG. 3 to produce substantially the same result with some alteration of circuitry. In FIG. 3, the element 30 comprises a body of semiconductor material advantageously of single crystal structure and including on the left-hand side a series of four zones of alternate conductivity type and on the right-hand side a series of three zones of alternate conductivity type. In particular, on the left-hand side adjacent to one face of the body 30 is a P-type zone 31 and at the other face of the body an N-type conductivity zone 34. Intermediate these two terminal zones 31 and 34 are an N-type intermediate zone 32 and a P-type intermediate zone 33. Zones 31, 32, 33 and 34 form a PNPN structure similar to that shown in FIG. 1. On the right-hand side, zones 32, 33 and 34 form an NPN structure similar to that shown in FIG. 1. A large area, low resistance electrode 35 is applied to one face of the body 30 so as to contact both zone 31 and zone 32. Serially connected to this electrode 35 is a resistance element 36 and output terminal III, corresponding to the like designated terminal of the arrangement of FIG. 1. A low resistance electrode 37 is applied to the other terminal zone 34 and is connected to the ground terminal 38. A first input terminal I is connected through a low resistance contact 39 at the left-hand side of the intermediate zone 33 and a second input terminal is attached through a low resistance contact 40 to the right-hand side of intermediate zone 33. The sheet or lateral resistance of zone 33 is made sufficiently high that electrodes 39 and 40 are adequately isolated electrically.

The operation of the arrangement shown in FIG. 3 is analogous to that of the embodiment of FIG. 1. An applied voltage designated $V_B$ is maintained on the terminal 41 and in the absence of conduction through the semiconductor body the output voltage at terminal III will be substantially $V_B$. When a trigger pulse is applied from pulse source 46 to input terminal I, the four-zone portion of the body 30, including the zones 31, 32, 33 and 34, breaks down and assumes the low impedance condition. As in the case of the basic PNPN element described above, conduction will continue in the left-hand portion so long as the required sustaining current is available. Upon the application of a second trigger pulse from pulse source 47 to the input terminal II, conduction will be induced in the right-hand or three-zone portion of the body 30 which includes the zones 32, 33 and 34. If the intermediate N-type region 32 is of a sufficiently high lateral resistivity, there is an effective separation of the current flow in the two portions of the body, and the conduction through the body will shift from the PNPN portion to the NPN portion. Consequently, the four-zone portion 31, 32, 33 and 34 will turn off and conduction will continue in the three-zone portion only so long as the trigger pulse is applied at input terminal II. Thus, the response of the embodiment of FIG. 3 is similar to that of the embodiment of FIG. 1, as graphically depicted in FIG. 2.

The semiconductor element 30 may be fabricated from a slice of N-type single crystal silicon having a resistivity of one ohm-centimeter. Such a slice, typically, is ten mils thick and about 250 mils by 250 mils square, from which between 50 and 72 individual elements are cut. The method described hereinafter is similar, in general, to that described in the application of J. Andrus, Serial No. 678,411, filed August 15, 1957, now abandoned. One face of the slice first is coated with a masking material, except for the surfaces contiguous to the P-type zones 31. This face then is subjected to a predeposition of boron at 1200 degrees centigrade for an hour, followed by a diffusion treatment at 1300 degrees centigrade for 16 hours.

This results in P-type conductivity zones having dimensions defined by the area of the unmasked surfaces to a depth of two mils from the face of the wafer. These P-type zones 31 have a sheet resistivity of from one to two ohms per square.

The opposite face of the slice then is polished and sufficient material is removed so that the thickness from the polished face to the boundary of the P-type zones 31 is about 1.3 mils. The upper face of the slice contiguous to the P-type zones 31 is masked completely, typically by producing an oxide coating thereon, and the lower face of the slice then is subjected to a boron prediffusion at 900 degrees centigrade for 30 minutes, followed by a further treatment at 1300 degrees centigrade for 45 minutes using the box diffusion technique disclosed in the application of B. T. Howard, Serial No. 740,958, filed June 9, 1958, now U.S. Patent No. 3,066,052. This treatment produces a P-type zone to a depth of .28 mil from the lower face of the slice and having a resistivity of about 70 ohm-centimeters. This diffusion step forms the region which ultimately becomes the P-type zone 33 of the body 30.

Finally, the terminal N-type zones 34 are produced by masking the lower face of the slice except for the surfaces contiguous to the zones 34 and subjecting this face to a phosphorus prediffusion at 1100 degrees centigrade for 60 minutes, followed by a diffusion at 1200 degrees for 30 minutes. As a consequence of this heat treatment, the boundary of the P-type zone 33 moves slightly farther into the wafer to a depth of .30 mil and the N-type conductivity zones 34 are produced having a depth of .1 mil and a resistivity of about one ohm-centimeter.

Before the slice is divided into individual elements the electrodes 35, 37, 39 and 40 are formed by vacuum deposition of suitable metals through masks, followed by a heat treatment to produce a slight alloying. In particular, the electrodes 35 and 37 may comprise a gold-antimony alloy including about one percent antimony, and the electrodes 39 and 40 typically are aluminum.

Finally, the slice is divided by etching or by ultrasonic cutting into a number of individual integrated elements, each about 35 mils long by 12 mils wide and about 3 mils thick. In one particular structure the P-type zone 31 has a dimension along the length of the wafer of from 5 to 9 mils and the N-type zone 34 a length of about 14 mils.

Although the invention has been described in terms of several specific embodiments, it will be understood that they are but illustrative and that other arrangements may be devised by those skilled in the art which are within the scope and spirit of the invention.

What is claimed is:

1. A bistable pulse generator comprising an integrated semiconductor structure including a wafer of semiconductor material, said wafer having two major faces and four successive zones of opposite conductivity type in substantially parallel relation with said faces, one of the terminal zones of said wafer and a portion of the intermediate zone adjacent to said one terminal zone being contiguous to one face of said wafer whereby one portion of the wafer includes four successive zones between the major faces and the other portion includes three successive zones between the major faces of the wafer, a first low resistance connection to said one face and common to both the zones contiguous thereto, a second low resistance connection to the other terminal zone, third and fourth low resistance connections to the intermediate zone adjacent to said other terminal zone, said third and fourth connections being at the opposite extremities of said zone, a first means including a resistance element for applying between said first and second low resistance connections a voltage which is less than the characteristic breakdown voltage of said semiconductor body, a second means for applying a voltage pulse to said third low resistance connection, a third means for applying a voltage pulse to said fourth low resistance connection, and an output terminal to said first low resistance connection.

2. A pulse generator in accordance with claim 1 in which said resistance element has a value of resistance such that the current which flows in the one portion of the wafer is at least as great as the current required to sustain such conduction.

References Cited in the file of this patent

UNITED STATES PATENTS

| | | |
|---|---|---|
| 2,460,456 | Hurley | Feb. 1, 1949 |
| 2,959,681 | Noyce | Nov. 8, 1960 |
| 2,982,868 | Emile | May 2, 1961 |

OTHER REFERENCES

General Electric Notes on the Application of the Silicon of the Silicon Controlled Rectifier, December 1958 (pp. 36 to 39), (pp. 37 and 39 relied on).

IBM Technical Disclosure, vol. 2, No. 5, February 1960, page 85.